United States Patent [19]

Kleinberg

[11] Patent Number: 5,399,993
[45] Date of Patent: Mar. 21, 1995

[54] HIGH INPUT IMPEDANCE AMPLIFIER

[75] Inventor: Leonard L. Kleinberg, Greenbelt, Md.

[73] Assignee: The United States of America as represented by the Administrator of the National Aeronautics and Space Administration, Washington, D.C.

[21] Appl. No.: 113,373

[22] Filed: Aug. 26, 1993

[51] Int. Cl.$^6$ .............................................. H03H 3/00
[52] U.S. Cl. .................................... 330/293; 330/291; 330/292; 330/294; 330/109
[58] Field of Search ............... 330/291, 292, 293, 294, 330/109, 110, 145

[56] References Cited

U.S. PATENT DOCUMENTS

| | | | |
|---|---|---|---|
| 3,588,725 | 5/1969 | Geffe | 330/110 |
| 3,810,035 | 5/1974 | Gundry | 330/145 |
| 4,560,963 | 12/1985 | Sharpe | 330/294 |

FOREIGN PATENT DOCUMENTS 2105543 9/1982 United Kingdom ................. 330/291

Primary Examiner—William L. Sikes
Assistant Examiner—Fetsum Abraham
Attorney, Agent, or Firm—Ronald F. Sandler; Robert D. Marchant; Guy M. Miller

[57] ABSTRACT

High input impedance amplifiers are provided which reduce the input impedance solely to a capacitive reactance, or, in a somewhat more complex design, provides an extremely high essentially infinite, capacitive reactance. In one embodiment, where the input impedance is reduced in essence, to solely a capacitive reactance, an operational amplifier in a follower configuration is driven at its non-inverting input and a resistor with a predetermined magnitude is connected between the inverting and non-inverting inputs. A second embodiment eliminates the capacitance from the input by adding a second stage to the first embodiment. The second stage is a second operational amplifier in a non-inverting gain-stage configuration where the output of the first follower stage drives the non-inverting input of the second stage and the output of the second stage is fed back to the non-inverting input of the first stage through a capacitor of a predetermined magnitude. These amplifiers, while generally useful, are very useful as sensor buffer amplifiers that may eliminate significant sources of error.

13 Claims, 1 Drawing Sheet

HIGH INPUT IMPEDANCE AMPLIFIER

The invention described herein was made by an employee of the United States Government, and may be manufactured and used by or for the Government for governmental purposes without the payment of any royalties thereon or therefor.

TECHNICAL FIELD

The invention pertains to amplifiers and, more particularly, to operational amplifiers employed as pre-amplifiers for sensor signals derived from sensors that change impedance with signal amplitude.

BACKGROUND ART

Numerous sensors that generate electronic output signals representing a sensed physical condition undergo a variation in their output impedance with signal amplitude. This is a characteristic of the sensor "on-chip" amplifiers. The fundamental problem caused by these amplitude variations is that the output signal from the on-chip amplifier will give false indications of sensed physical conditions. An explanation of this result may be given as follows.

A sensor with its on-chip amplifier (herein referred to as the "sensor") may be viewed as composed of a voltage source in series with an impedance. The output of this circuit is likely to be in the millivolt to volt range and will require further amplification with what may be characterized as a pre-amplifier with an input impedance that is generally large with respect to the sensor impedance. When the sensor impedance undergoes a variation due to signal amplitude, the sensor output will not only indicate a variation due to changes in the sensed physical condition but also, because of the variation of the sensor impedance, an error component. The signal to the pre-amplifier, then, is derived from the junction of a divider composed of the varying sensor impedance and the pre-amplifier input impedance.

While sensor errors are caused by sensor impedance variations that are dependent on signal amplitude, errors are also introduced by the characteristics of the pre-amplifier or other signal processing amplifiers that follow the sensor on-chip amplifiers. The current technology generally employs operational amplifiers because of some positive characteristics that they possess for this application, such as high open loop voltage gain, low current noise, and small inter-electrode capacitance between the inverting- and non-inverting inputs. However, the use of operational amplifiers also introduces a primary negative characteristic that causes the introduction of errors in the form of a one-pole frequency characteristic which results in a boot-straped input impedance that is not constant with frequency, i.e., the input impedance varies with the frequency of the applied signal. This results in a configuration or equivalent circuit comprised of a signal source, including a voltage source and a series source impedance that varies with signal amplitude, which, in turn, is followed by another impedance, the amplifier input impedance, that varies with signal frequency. If the amplifier input impedance could be made constant with frequency and very high relative to the sensor source impedance, the effect of variation of the source impedance on error production can be minimized. In other words, the varying sensor source impedance would have a negligible effect on the network transfer function, from voltage source to the pre-amplifier, if the pre-amplifier input impedance is made very large. The prior art recognized the existence of the error sources but the solutions provided were partial.

The prior art, when employing these sensors, e.g., a CCD array where each CCD is followed by an on-chip FET amplifier, recognized that the sensors, due to the on-chip amplifier design, have a high source impedance characteristic. To minimize the effect of the source impedance variations that occur with sensor generated voltage variations, the prior art employed buffer circuits as input stages of the signal processing amplifiers. The buffer amplifiers, for example, employed single bipolar transistors, single FETs, as well as operational amplifier followers, as previously noted. However, while the buffers could provide a very large input impedance at low frequencies, they all suffer a reduction in input impedance with increasing frequency that may become rather severe at very high frequencies.

SUMMARY OF THE INVENTION

Accordingly, it is an object of the invention to provide an improved buffer amplifier.

It is a further object of this invention to provide a buffer amplifier that maintains a high input impedance characteristic at very high frequencies.

It is another object of this invention to provide a high gain, single pole amplifier with a very high input impedance characteristic that may be maintained at very high frequencies.

It is still another object of this invention to provide a buffer amplifier that can maintain a very high input impedance at very high frequencies, limited only by the amplifier's frequency cut-off characteristic and its ability to function with a single pole response.

It is still a further object of this invention to provide an improved operational amplifier follower.

According to the present invention, these and other objects are obtained by providing a resistance of predetermined magnitude in parallel with any stray, interelectrode or other capacitance appearing at the input terminal of a buffer amplifier. The buffer amplifier may be loaded with additional circuitry that appears as a negative capacitance, in parallel with the above-noted capacitance, of substantially equivalent magnitude.

DETAILED DESCRIPTION OF THE INVENTION

Figure 1:
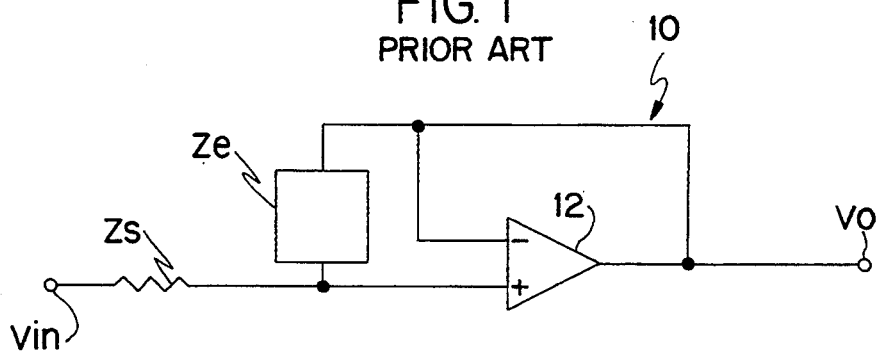
FIG. 1 is a schematic diagram of a buffer circuit that exemplifies prior art buffer circuits employing operational amplifiers.

Referring now to the drawings wherein like reference numerals and characters designate identical or corresponding parts, and more particularly to FIG. 1, wherein the buffer amplifier 10, illustrating the problem resolved by the instant invention, is shown as including an operational amplifier 12. The amplifier is in a follower configuration with the output terminal connected directly to the inverting input and with impedance Ze representing the interelectrode impedance between the inverting and non-inverting inputs. This impedance has both resistive and capacitive components, but for higher frequencies, the capacitance dominates and the resistive component may be ignored. The circuit further includes impedance Zs that represents the source impedance which, for the sensor amplifiers referred to above, is essentially resistive. When viewed looking into the circuit input, Vin, the voltage source, sees a series resistance and the operational amplifier interelectrode impedance which is effectively capacitive at resonance and above. Resonance is shown in the analysis that follows. In the follower configuration, the output terminal, Vo, is connected directly to the inverting input. It may not be readily apparent that while the interelectrode impedance is, in a dominant sense, capacitive, the amplifier has a frequency band where the circuit is in resonance. The resistive portion of the interelectrode impedance may normally be ignored because it is normally very high, in the megohm range.

An analysis of amplifier 10 may be made at resonance with the sensor voltage working into a capacitance. The current that flows through impedance Ze is:

$$I = \frac{V_{in} - V_o}{Z_s + Z_e} \quad (1)$$

The voltage across Ze, Ve, the input voltage to amplifier 12 itself, may be expressed as:

$$V_e = Z_e \frac{(V_{in} - V_o)}{(Z_s + Z_e)} \quad (2)$$

The output voltage, Vo, may be expressed as:

$$V_o = K(\omega) V_e \quad (3)$$

Employing the above equations to derive an equation for Vo/Vin, the following is obtained:

$$\frac{V_o}{V_{in}} = \frac{K(\omega)}{1 + \frac{Z_s}{Z_e} + K(\omega)} \quad (4)$$

At high frequencies the gain for the amplifier may be characterized as $k_o/(1+j\omega/\omega_3)$, where $k_o$ is the gain at 0 Hz and $\omega_3$ are the radians at the 3 db point. This expression for high frequency gain may be simplified, as an approximation, to $-j\omega_G/\omega$, where $\omega_G$ is $k_o\omega_3$ and is the radian gain bandwidth product. This simplified expression takes the form of equation 5.

$$\frac{V_o}{V_{in}} = \frac{-j\frac{\omega_G}{\omega}}{1 + \frac{Z_s}{Z_e} - j\frac{\omega_G}{\omega}} \quad (5)$$

For Zs=Rs and Ze=1/jωC, and where C is the interelectrode capacitance of the operational amplifier employed.

$$\frac{V_o}{V_{in}} = \frac{-j\frac{\omega_G}{\omega}}{1 - j\left(\frac{\omega_G}{\omega} - \omega R_s C\right)} \quad (6)$$

The above analysis shows that resonance occurs when the magnitude of $\omega_G/\omega$ equals the magnitude of $\omega R_s C$ or, stated otherwise, when $\omega^2 = \omega_G \omega_S$, where $\omega_S = 1/R_s C$ and "S" indicates source. The voltage gain is $-j\omega_G/\omega$, $-j\omega_G/(\omega_G\omega_S)^{1/2}$, which equals $-j(\omega_G/\omega_S)^{1/2}$. The Q of the bandpass is $\omega_G/\omega_S$ or, expressed otherwise, $(\omega_G/\omega_S)^{1/2}$. Where the source impedance Zs is resistive and in the order of 1KΩ, and, for the purpose of illustration, an OP-27 is chosen for operational amplifier 12 which has an $F_G$ of $10^7$ and an interelectrode capacitance of 0.002 μfd (the value of Ze), the analysis indicates both a Q and a gain with a magnitude of about 11 or 12 where the gain has a 90 degree lag as shown by the $-j$ factor. It should be noted that a 2 pf interelectrode capacitance is considered to be representative for high frequency operational amplifiers.

In a broader sense, the analysis demonstrates two important concepts. One concept is that the circuit depicted in FIG. 1 in fact has a bandpass characteristic, and not simply a high frequency roll-off characteristic. For the FIG. 1 circuit, in a follower configuration with the above-indicated parameters, the gain would be essentially unity out to about 1MHz at which frequency there would be a sharply rising resonance region with a gain of about 12 or 13 and a bandwidth of about 80 kHz. This means that, for some applications, this bandpass characteristic could be an unexpected source of errors. For example, if such a circuit was indiscriminately employed as a buffer to drive an A/D converter, anomalous resonance may occur. The second concept demonstrated by the above analysis is that a simple bandpass amplifier, or, for that matter, an oscillator, may be constructed from this circuit with some slight modifications.

The input impedance of the FIG. 1 circuit looking into the non-inverting terminal of the op-27 is given by the well known equation:

$$Z_{in} = Z_e(1 + K) = \frac{1}{j\omega C}\left(1 - \frac{j\omega_G}{\omega}\right) = \frac{1}{j\omega C} - \frac{\omega_G}{\omega^2 C} \quad (7)$$

This equation shows that the input impedance consists of a capacitive reactance in series with a negative resistance. This is not satisfactory for the stated purpose of such a circuit, i.e., to provide a buffer that does not produce resonance caused errors. It is, in other words, desireable to have a buffer that has a flat, unity gain characteristic over all frequencies of interest, as well as one that maintains a high input impedance over all frequencies of interest. Equation (7) allows the source of resonance to be easily visualized. Resonance may be viewed as being caused by an input impedance that varies with frequency. If the circuit is driven from a resistive source, that source, as the driving impedance, sees the capacitance and the negative resistance that form a portion of the buffer input impedance. (It should be understood that the source will also see a very high interelectrode resistance that in terms of its effect, may be ignored.) At a radian frequency defined by $\omega = \sqrt{\omega_G/R_S C}$, the negative resistance component of the buffer input impedance will be equal to the source resistance Rs. As previously shown, this occurs at the derived resonant frequency where the total effective input impedance is capacitive, i.e., $1/j\omega C$.

Figure 2:
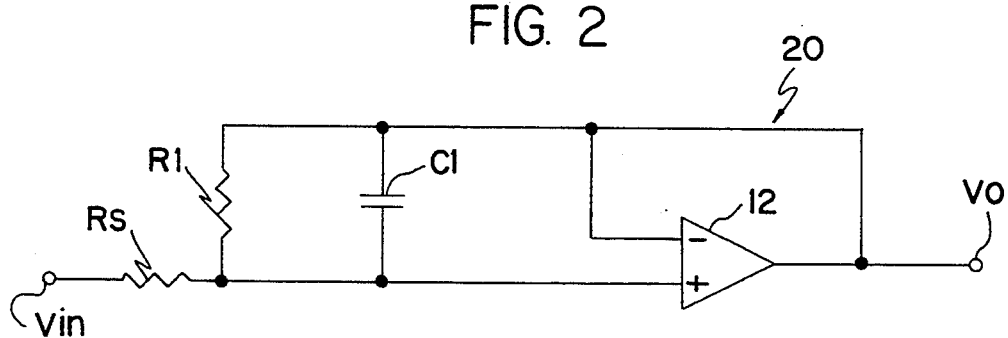
FIG. 2 is a schematic diagram of an operational amplifier buffer circuit in accordance with the present invention.

Accordingly, it is desirable to moderate or eliminate the resonance characteristic of the buffer circuit of FIG. 1 to provide an essentially flat gain characteristic beyond any frequency of interest, this to be achieved with as little complexity as possible. The buffer circuit 20 of FIG. 2 achieves such a result. Similar to circuit 10, operational amplifier 12 is shown in a follower configuration where the inverting input is connected directly to the output terminal. Resistor R1 is simply added across the inverting and non-inverting input terminals. In effect, this places the added resistor across the interelectrode impedance, which is, in terms of effect as an error source, capacitive, and is now shown, for the purpose of illustration, as an external capacitance C1.

By adding R1 across the input terminals in parallel with C1, and further, imposing the condition that $R1C1 = 1/\omega_G$, the input impedance at the non-inverting terminal is $1/j\omega C1$. Rewriting equation (7):

$$Zin = \frac{R\frac{1}{j\omega C}}{R + \frac{1}{j\omega C}} \left(1 - \frac{j\omega_G}{\omega}\right) = \frac{1}{j\omega C}$$

The equation for voltage gain becomes:

$$\frac{Vo}{Vin} = \frac{1}{(1 + j\omega RsC)} - \frac{-j\frac{\omega_G}{\omega}}{\left(1 - \frac{j\omega_G}{\omega}\right)} =$$

$$\frac{-j\frac{\omega_G}{\omega}}{1 + \omega_G RsC - j\left(\frac{\omega_G}{\omega} - \omega RsC\right)}$$

Figure 3:
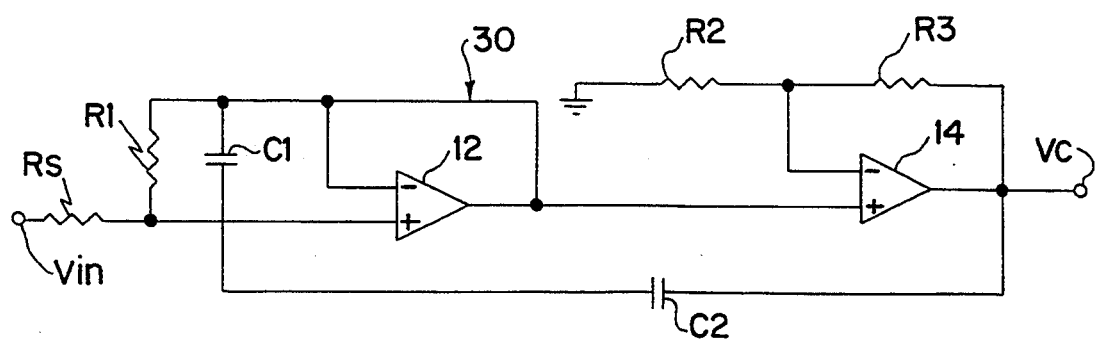
FIG. 3 is a another schematic diagram of another operational amplifier buffer circuit of this invention.

For operational frequencies that are significantly less than $\omega_G$, the voltage gain, Vo/Vin, is close to unity and system accuracy will not be impaired by errors caused by buffer resonance. System accuracy would be even further enhanced under conditions where the interelectrode capacitance is reduced or preferably eliminated entirely. FIG. 3 is such a circuit.

FIG. 3 depicts a buffer amplifier 30 which can reduce or eliminate the effect of the interelectrode capacitance by generating a negative capacitance in parallel with the interelectrode capacitance of an operational amplifier seen by the source impedance. Operational amplifier 12 is shown in a follower configuration with R1 and C1 in parallel across its inverting and non-inverting terminals and a short-circuit or wire connection between its inverting and output terminals. The resistive source impedance, Rs, is illustrated as connected from the signal input, Vin, to the non-inverting terminal of operational amplifier 12. Accordingly, operational amplifier 12, as described thus far, is identical to circuit 20 depicted in FIG. 2. The output of operational amplifier 12 is then connected to the non-inverting input terminal of a second operational amplifier 14. The inverting input terminal of operational amplifier 14 is connected to the common connection between a resistor R2 and a resistor R3. The other side of resistor R2 is, in turn, connected to ground, while the other side of resistor R3 is connected to the output terminal of amplifier 14. This output terminal is also connected to one end of a capacitor C2 while the other end of capacitor C2 is, in turn, connected to the non-inverting input terminal of operational amplifier 12. The output of buffer amplifier 30 is taken from the output terminal of operational amplifier 14 and is usually used to drive further signal processing electronics. Operational amplifier 14, in the disclosed configuration, is a non-inverting gain stage where the gain cannot be less than unity because the gain of such a stage is equal to $1 + R3/R2$. The negative capacitance, fed back to the input of operational amplifier 12, is given by the expression $-R3/R2 \times C2$.

If the total interelectrode capacitance of amplifier 12 is 0.1 pf and the source impedance, Rs, equals 1K$\Omega$, the corner frequency is about 1.6 GHz. Having a bandpass characteristic that is essentially level out to 1.6 GHz would be more than sufficient where the buffer is operating in a signal processing environment with signals of interest in the range of 1 to 5 MHz. Equation (9), with near infinite input impedance, still reduces to a conventional expression for the gain of a follower.

In summary, the invention provides an amplifier that effectively eliminates the effect of variation of sensor impedance with sensed amplitude by providing an input impedance that is maintained constant and high throughout frequencies of interest and eliminates the amplifier resonance characteristic throughout frequencies of interest.

I claim:

1. A electronic amplifier having an input terminal and an output terminal including:
    means to place said amplifier in a follower configuration;
    means to receive an input signal at said input terminal; and
    means to reduce the impedance appearing at said input terminal to, in essence, solely a capacitive reactance.

2. The electronic amplifier of claim 1 wherein said electronic amplifier is an operational amplifier.

3. The electronic amplifier of claim 1 wherein said impedance reducing means is a resistor connected to said input terminal.

4. The electronic amplifier of claim 3 wherein said electronic amplifier is an operational amplifier and said resistor has a magnitude equal to the reciprocal of the product of $\omega_G$ times the interelectrode capacitance appearing between the input terminals of said operational amplifier.

5. A buffer circuit including first and second amplifiers, each having an input terminal and an output terminal, comprising:
    means to place said first amplifier in a follower configuration;
    means to receive an input signal at the input terminal of said first amplifier;
    means to reduce the impedance appearing at the input terminal of said first amplifier to, in essence, solely a capacitive reactance; and,
    means to increase said capacitive reactance, in essence, to an infinite magnitude.

6. The buffer circuit of claim 5 wherein said first and second amplifiers are operational amplifiers.

7. The buffer circuit of claim 5 wherein said impedance reducing means is a resistor having a magnitude equal to the reciprocal of the product of $\omega_G$ times the interelectrode capacitance.

8. The buffer circuit of claim 5 wherein said means to increase said capacitive reactance to essentially infinity is a means to produce a negative capacitance with a magnitude that is essentially the same as the capacitive reactance appearing at the input terminal of said first amplifier.

9. The buffer circuit of claim 8 wherein said means to produce a negative capacitance includes said second amplifier whose output is connected to said input terminal of said first amplifier by a capacitor.

10. The buffer circuit of claim 9 wherein said capacitor has a predetermined magnitude, said magnitude being one factor in determining the magnitude of negative capacitance.

11. The buffer circuit of claim 8 wherein said means to increase said capacitive reactance includes said second amplifier, said second amplifier being an operational amplifier in a non-inverting, gain stage configuration.

12. A buffer circuit including first and second operational amplifiers:

said first operational amplifier being in a follower configuration with its output terminal being directly connected to its inverting input terminal, having means to apply an input signal to its non-inverting input terminal, and a first resistor connected between its inverting and non-inverting input terminals;

said second operational amplifier being in a non-inverting, gain stage configuration with the output terminal of said first operational amplifier being connected to the non-inverting input terminal of said second operational amplifier, said second operational amplifier additionally having a second resistor connected from its inverting input terminal to ground, a third resistor connected from its inverting input terminal to its output terminal and a capacitor connected from its output to the non-inverting input terminal of said first operational amplifier.

13. The buffer circuit of claim 12 wherein said resistor has a predetermined magnitude to effectively eliminate the amount of interelectrode negative resistance appearing between the input terminals of said first operational amplifier and said second and third resistors and said capacitor have predetermined magnitudes to produce a negative capacitance to effectively reduce the amount of interelectrode capacitance appearing between the input terminals of said first operational amplifier.

* * * * *